United States Patent
Sapp et al.

(10) Patent No.: US 6,424,035 B1
(45) Date of Patent: Jul. 23, 2002

(54) SEMICONDUCTOR BILATERAL SWITCH

(75) Inventors: Steven Paul Sapp, Felton; David S. Schoenwald, Los Gatos, both of CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/186,770

(22) Filed: Nov. 5, 1998

(51) Int. Cl.[7] .................. H01L 23/34; H01L 23/48; H02H 5/04; H02B 1/24
(52) U.S. Cl. .................. 257/723; 257/724; 257/776; 257/173; 257/782; 257/783; 257/777; 257/692; 257/784; 361/104; 307/112
(58) Field of Search .................. 257/723–24, 776, 257/173, 784, 782–83, 773, 692, 777; 361/104; 307/112

(56) References Cited

U.S. PATENT DOCUMENTS

| | | | | |
|---|---|---|---|---|
| 4,477,742 A | * | 10/1984 | Janutka | ................. 307/571 |
| 5,018,041 A | * | 5/1991 | Szepesi | ................. 361/18 |
| 5,084,753 A | * | 1/1992 | Goida et al. | |
| 5,142,215 A | * | 8/1992 | Mathison | ................. 320/40 |
| 5,170,337 A | * | 12/1992 | Borowiec et al. | ............ 363/147 |
| 5,485,342 A | * | 1/1996 | Sugino et al. | ............... 361/104 |
| 5,539,299 A | * | 7/1996 | Fernandez et al. | ............ 320/39 |
| 5,616,970 A | * | 4/1997 | Dittrich | ................. 307/126 |
| 5,646,520 A | * | 7/1997 | Frank et al. | ............. 324/158.1 |
| 5,774,000 A | * | 6/1998 | Vercellotti et al. | ........... 327/110 |
| 5,801,572 A | * | 9/1998 | Nakamura | ................. 327/434 |
| 6,159,765 A | * | 12/2000 | Drehobl et al. | .............. 438/106 |
| 6,184,585 B1 | * | 2/2001 | Martinez et al. | ............. 257/777 |

\* cited by examiner

Primary Examiner—Stephen D. Meier
Assistant Examiner—James Mitchell
(74) Attorney, Agent, or Firm—Babak S. Sani; Townsend and Townsend and Crew, LLP

(57) ABSTRACT

A semiconductor bilateral switch that minimizes the on-state resistance by making a common-source connection between the switch transistors internal to the package. Wire bonds internally connecting the source electrodes of the transistors also provide the function of one or both of a current sense resistor and fuse element.

21 Claims, 2 Drawing Sheets

SEMICONDUCTOR BILATERAL SWITCH

BACKGROUND OF THE INVENTION

The present invention relates in general to semiconductor switching devices, and in particular to a more efficient implementation of a bilateral load switch that exhibits lower resistance.

There are many electronic applications that require high-current switches for connecting or disconnecting a power source (e.g., a battery) from a load. Portable electronic devices, for example, have rechargeable batteries that connect to a charger by such a switch. To protect the battery from overcharging and from damage due to excessive current, current flow from the charger is monitored to detect when the battery has been fully charge. This is typically accomplished by sensing the voltage drop across a small value resistor in series with the switch and feeding this information back to a microcontroller to determine the charge state. A very good switch, having good off-state isolation and minimum on-state resistance, is needed to disconnect the charger from the battery once a fully charged state is detected. P-channel power field-effect transistors (MOSFETs) are often used as the switching component because of their exceptionally low on-state source-drain resistance (RDSON), and their ability to interface easily to the control circuitry.

Conventional power MOSFETs have an intrinsic diode element that allows damaging current to flow if the battery or the charger is connected in reverse polarity. For this reason, it is known to connect a pair of p-channel MOSFETs so that their diodes oppose each other to prevent reverse connection damage. FIG. 1 shows a switch made up of two p-channel MOSFETs MP1 and MP2 connected in a common-source configuration with their intrinsic diodes 100 and 102 opposing each other. The switch circuit also includes an n-channel MOSFET MN1 that drives the gate terminals of transistors MP1 and MP2. Turning on MN1 pulls the gate terminals of MP1 and MP2 down to ground and biases the p-channels into an on (i.e., conductive) state. When turned on and conducting, current can flow in either direction between the two terminals IN and OUT. A fuse element 104 is commonly inserted along this current path to protect against over-current conditions. A series resistor Rs is also provided along this current path, a magnitude of a voltage drop across which is sensed by external circuitry and used to indicate the level of charge transfer. Resistors R1 and R2 are used to control the slew rate of transistors MP1 and MP2 when turning on (R2) and turning off (R1).

Existing implementations of this type of switch provide two independent transistors, and the remaining components external to the chip. A typical example is shown in FIG. 2 where to reduce RDSON, the source electrode of each one of the two transistors MP1 and MP2 has been provided with four leads 200, 202, 204 and 206. Each lead connects to the internal source electrode of a transistor via multiple (e.g., 4) bond wires 208, to further reduce the on resistance of the switch. A number of other leads are provided to facilitate external connections to the fuse, Rs, slew control resistors and control and power pins. This arrangement not only results in a device with a larger pin count, it requires numerous bond wires (e.g., 8 wires for each source connection) in addition to the various external components (fuse element, sense resistor Rs, and slew rate control resistors R1 and R2).

SUMMARY OF THE INVENTION

The present invention offers a novel implementation of a high current bilateral switch that greatly simplifies the component requirements while at the same time simplifying the construction of the power transistors. Broadly, the bilateral switch of the present invention minimizes the on-state resistance by making a common-source connection between the switch transistors internal to the package. Wire bonds internally connecting the source electrodes of the transistors also provide the function of one or both of a current sense resistor and a fuse element. In a preferred embodiment, the same element that is used to implement the internal sense resistor also acts as the fuse element. The resistance and fusing current of the sense resistor implemented according to this embodiment can be adjusted by the type of material used, the dimensions and the number of the bonding wires. The resulting switch requires fewer external components, fewer pins and is more economical to manufacture.

Accordingly, in one embodiment, the present invention provides a semiconductor switch housed inside a package, the switch including a first transistor having a source electrode, a drain electrode and a gate electrode; a second transistor having a source electrode, a drain electrode and a gate electrode; and a common-source bond wire electrically connecting the source electrode of the first transistor directly to the source electrode of the second transistor. The switch further includes a first source bond wire connecting the source electrode of the first transistor to a first external connector, and a second source bond wire connecting the source electrode of the second transistor to a second external connector, wherein, the common-source bond wire acts as an internal sense resistor. In another embodiment, the common-source bond wire also acts as a fuse element.

In yet another embodiment, the present invention provides a bilateral semiconductor switch inside a package, the switch including a first power transistor having a source electrode, a drain electrode coupled to a first I/O terminal and a gate electrode; a second transistor having a source electrode, a drain electrode coupled to a second I/O terminal, and a gate electrode; a sense resistor connecting the source electrode of the first transistor to the source electrode of the second transistor; and a control transistor having a gate electrode coupled to receive a control signal, a source electrode coupled to receive a low signal level, and a drain electrode adapted to be externally coupled to be the gate electrodes of the first and the second transistors. The switch further includes a fuse element connecting in series between the sense resistor and the source electrode of one of the first or second transistors.

A better understanding of the nature and advantages of the low resistance bilateral load switch of the present invention may be gained with reference to the detailed description and drawings below.

DESCRIPTION OF THE SPECIFIC EMBODIMENTS

Figure 1:
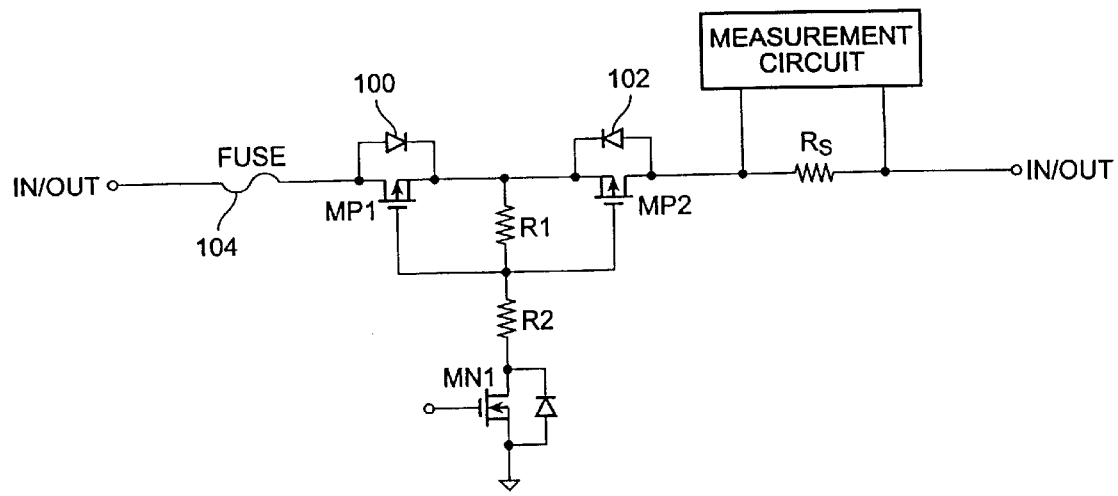
FIG. 1 illustrates one embodiment for a prior art bilateral switch circuit.
Figure 2:
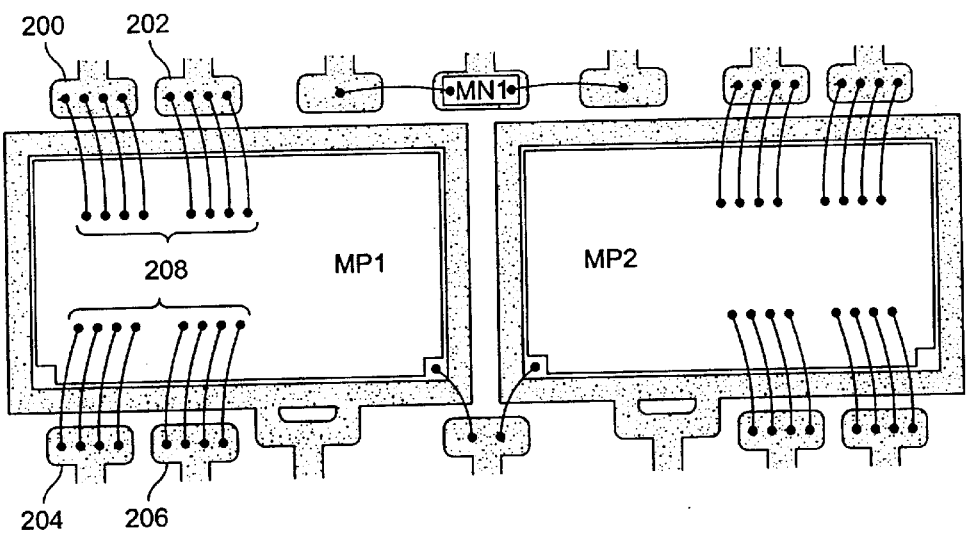
FIG. 2 shows conventional packaging for the bilateral switch circuit shown in FIG. 1.
Figure 3:
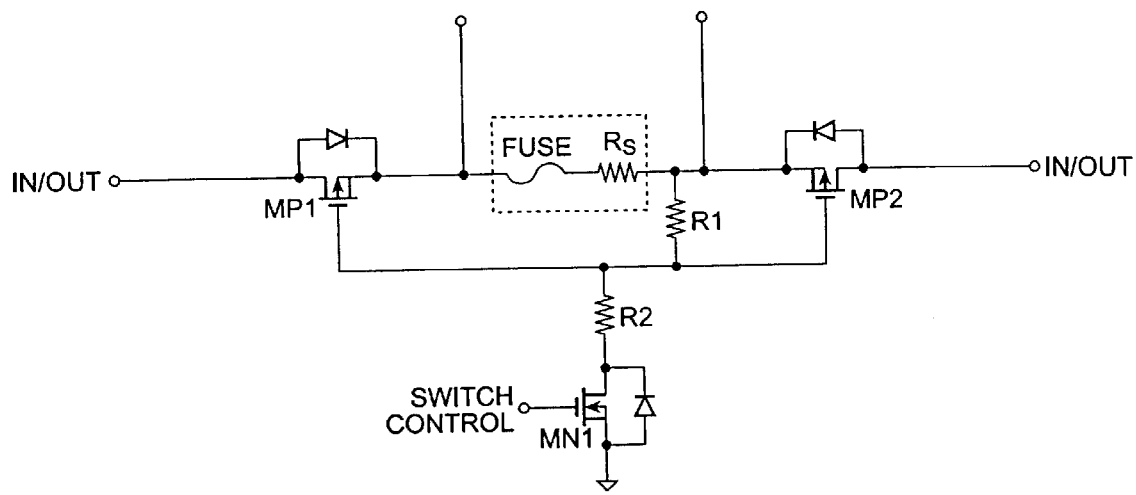
FIG. 3 shows an improved bilateral switch circuit according to one embodiment of the present invention.

To further reduce the on-state resistance of a bilateral switch of the type shown in FIGS. 1 and 2, while at the same time reducing pin count requirement and cost of manufacture, the present invention incorporates in various embodiments either one or both of the sense resistor and the fuse element into the switch package. The circuit schematic for the switch according to the present invention is shown in FIG. 3. The circuit components are similar to those shown in FIG. 1, however, the location of the sense resistor Rs and the fuse element have been changed. As shown in FIG. 3, sense resistor Rs and fuse element 300 connect in series with the source terminals (instead of drain terminals) of transistors MP1 and MP2. While this circuit diagram shows both of these components connecting to the internal source terminals, it is to be understood that other embodiments in which only one of these elements connects to the internal source node (while the other one is maintained external to the device) are also possible and fall within the scope of this invention.

Referring back to the circuit of FIG. 3, fuse 300 and sense resistor Rs in their new locations still connect in series along the current path of the switch. Thus, both of these components are capable of performing their respective functions related to the magnitude of current flowing through the switch. According to the present invention, however, the new design with the source side Rs and fuse, affords a number of advantages in terms of manufacturability and overall switch performance. A significant reduction in the on-state resistance of the switch is achieved by implementing sense resistor Rs by an element that is internal to the package that houses the switch. Connecting the source electrodes of transistor MP1 and MP2 internally by an internal Rs element eliminates the need for bringing these electrodes out on external pins to externally form the common-source connection. Thus, the need for multiple lead elements each having multiple bond wires connecting them to the source electrodes of the transistors (as shown in FIG. 2) is obviated by the present invention. At the same time, the user need not provide the external Rs as was required by the prior art switches.

Figure 4:
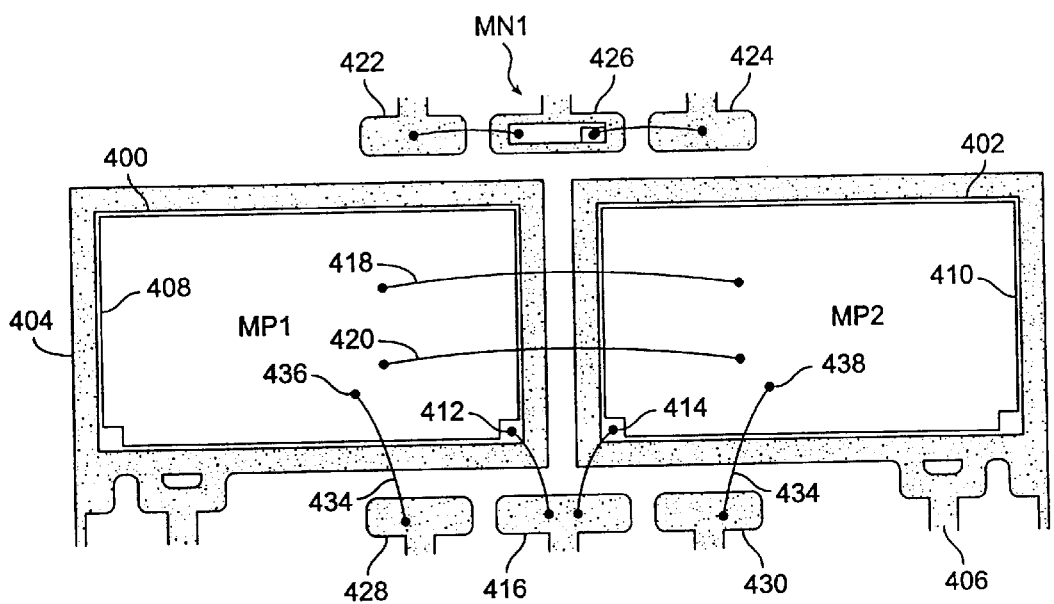
FIG. 4 illustrates a preferred method of constructing the improved bilateral switch according to the present invention.

Referring to FIG. 4, there is shown a preferred method of constructing the improved bilateral switch in a package according to the present invention. The package includes a first silicon die 400 comprising power PMOS transistor MP1 next to a second silicon die 402 comprising power PMOS transistor MP2. The power transistors are of vertical type so that the substrate of each die forms the drain electrode. In this embodiment, the substrate of each die is attached, and makes electrical contact, to a bottom metal plate that extends out as drain lead 404 for transistor MP1 and lead 406 for transistor MP2. No bond wires are therefore required for the connection between the drain electrodes and their respective leads. On the top surface of each die 400 and 402, conductive layers 408 and 410 form the source electrodes of each power transistor. The exposed gate areas at the corner of each die provide gate contact area 412 and 414 for each power transistor. As the two gate terminals of MP1 and MP2 connect to each other, a bond wire connects each gate contact area 412 and 414 to the same gate lead 416. The common-source connection is made, in this exemplary embodiment of the invention, by two bond wires 418 and 420 that simply interconnect source electrode 408 of transistor MP1 to source electrode 410 of transistor MP2. The common-source connection between transistors MP1 and MP2 therefore does not occur external to the package.

In the embodiment shown, the package further includes a control transistor MN1 that has its source and gate electrodes wire bonded to respective leads 422 and 424, and its drain electrode attached to lead 426. Therefore, lead 422 receives ground, lead 426 connects to slew rate control resistor R2, and lead 424 receives the switch control signal. It is to be understood that other types of circuitry could be used in place of transistor MN1, to implement the control feature. The control feature could be implemented by, for example, a bipolar (NPN) transistor, or a circuit that provides for selectable slew rate control. In an alternative embodiment, control resistors R1 and R2 are also integrated inside the device as part of the slew rate control circuitry.

In one embodiment of the present invention, bond wires 418 and 420 that make the common-source connection also act as an internal sense resistor Rs. The resistance of this connection can be adjusted by the number of wires, their length and diameter, and the resistivity of the wire material. To allow measurement of the voltage drop across Rs by external circuitry, two externally connectable terminals are provided. These are leads 428 and 430 that are wire bonded by wires 432 and 434 to source electrodes 408 and 410, respectively. Contact points 436 and 438 between bond wire 412 and 434 and source electrodes 408 and 410 are preferably located such that any added resistance due to the source conductive layer is minimized. That is, the distance between contact points 436 and 438 should preferably approximate the length of wire bonds 418 and 420.

While this embodiment eliminates the external Rs, an external fuse would still be required. According to another embodiment of the present invention, however, the external fuse is also eliminated by having the internal common-source bond wires also function as a fuse element. Using wires with properly selected properties, the common-source bond wires can be designed to melt in the event of high current above a specific magnitude. The wires can be made of electrically conductive materials such as aluminum or gold. Typical examples of dimensions may be 2 mils for the diameter of the wire and about 100–120 mils for the length. With these exemplary particulars, using two wires may result in a sense resistor having approximately 20 milliOhms resistance, and a fuse rating of approximately 7 Amps.

Using the package shown in FIG. 4, the circuit of FIG. 2 can be implemented as follows. Leads 404 and 406 form the I/O terminals of the switch and connect between e.g., a battery and its load. Resistor R2 connects between lead 424 (drain terminal of MN1) and lead 416 (gate terminals of MP1 and MP2). Lead 422 (source terminal of MN1) connects to ground, and lead 426 (gate terminal of MN1) receives the switch control signal. An external voltage measurement device connects across leads 428 and 430 to measure the amount of current flowing through the switch. No external sense resistor Rs or fuse element 104 are required. With this embodiment, in the case of a blown fuse, the part would have to be discarded since it would no longer have a functional sense resistor and the transistors would no longer be connected in a common-source fashion. Although, leads 428 and 430 provide external connectability to the source electrodes of the power transistors, it would be relatively resistive. When the common-source bond wires are intact, the switch implemented according to the embodiment shown in FIG. 4 can achieve a total drain-to-drain resistance (including Rs) of less than 0.07 Ohms with a typical process technology reflecting the current state of the art. It is to be understood that the number of wires as well the type and dimensions given here are for illustrative purposes only and are not limiting. Furthermore, alternative embodiments wherein other components such as the slew rate limiting resistors are implemented inside the package are possible.

In conclusion, the present invention provides a semiconductor bilateral switch that minimizes the on-state resistance by making a common-source connection between the switch transistors internal to the package. Wire bonds internally connecting the source electrodes of the transistors also provide the function of one or both of a current sense resistor and fuse element. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A semiconductor switch housed inside a package, the switch comprising:
    a first transistor having a source electrode, a drain electrode coupled to a first input/output terminal of the switch, and a gate electrode;
    a second transistor having a source electrode, a drain electrode coupled to a second input/output terminal of the switch, and a gate electrode; and
    a common-source bond wire configured to internally connect a first contact point on the source electrode of the first transistor directly to a second contact point on the source electrode of the second transistor.

2. The semiconductor switch of claim 1 further comprising:
    a first source bond wire connecting a third contact point on the source electrode of the first transistor to a first lead; and
    a second source bond wire connecting a fourth contact point on the source electrode of the second transistor to a second lead,
    wherein, the common-source bond wire acts as an internal sense resistor, a magnitude of current across which is measured by external circuitry via the first and second leads.

3. The semiconductor switch of claim 2 wherein the common-source bond wire also acts as a fuse element configured to disconnect a current path between the source electrode of the first transistor and the source electrode of the second transistor when the magnitude of current reaches a predetermined level.

4. The semiconductor switch of claim 3 wherein the gate terminal of the first transistor and the gate terminal of the second transistor connect to a single gate lead via a first gate bond wire and a second gate bond wire, respectively.

5. The semiconductor switch of claim 3 further comprising a control transistor having a source electrode connected to a third lead via a bond wire, a gate electrode connected to a fourth lead via a bond wire, and a drain electrode attached to a fifth lead.

6. The semiconductor switch of claim 5 wherein the first and second transistors are p-channel power field effect transistors, and the control transistor is an n-channel field effect transistor.

7. The semiconductor switch of claim 6 wherein the third lead receives ground, the fourth lead receives a switch control signal and the fifth lead couples to the single gate lead via a first external resistor.

8. The semiconductor switch of claim 7 wherein the drain electrode of the first transistor connects via a bond wire to a first input/output lead, and the drain electrode of the second transistor connects via a bond wire to a second input/output lead.

9. The semiconductor switch of claim 7 wherein a second external resistor couples the single gate lead to one of the first or second leads.

10. The semiconductor switch of claim 2 wherein a distance between the first contact point and the second contact point is substantially equal to a distance between the third contact point and the fourth contact point.

11. The semiconductor switch of claim 10 wherein the common-source bond wire comprises a plurality of bond wires connected in parallel.

12. A bilateral semiconductor switch housed inside a package, the switch comprising:
    a first power transistor having a source electrode, a drain electrode coupled to a first I/O terminal and a gate electrode;
    a second transistor having a source electrode, a drain electrode coupled to a second I/O terminal, and a gate electrode; and
    a sense resistor internal to the package, configured to connect the source electrode of the first transistor to the source electrode of the second transistor.

13. The switch of claim 12 further comprising a fuse element internal to the package and configured to couple in series between the source electrode of the first power transistor and the source electrode of the second power transistor.

14. The switch of claim 13 wherein the sense resistor comprises a bond wire having predetermined dimensions to obtain a desired resistance value.

15. The switch of claim 14 wherein the bond wire also acts as the fuse element, and wherein the length and diameter of the bond wire are adjusted to obtain a current-carrying tolerance of a selected magnitude greater then which the bond wire disconnects.

16. The switch of claim 14 wherein the sense resistor comprises a plurality of bond wires.

17. A semiconductor bilateral switch housed inside a package, the switch comprising:
    a first silicon die comprising a first vertical p-channel power field effect transistor having a substrate attached to a first lead to form a drain terminal, a gate electrode connected to a second lead via a first bond wire, and a top conductive layer forming a source electrode;
    a second silicon die comprising a second vertical p-channel power field effect transistor having a substrate attached to a third lead to form a drain terminal, a gate electrode connected to the second lead via a second bond wire, and a top conductive layer forming a source electrode; and
    a common-source bond wire connecting the source electrode of the first vertical p-channel power field-effect transistor to the source electrode of the second vertical p-channel field effect transistor.

18. The switch of claim 17 further comprising:
    a first source bond wire connecting the source electrode of the first vertical p-channel power field-effect transistor to a fourth lead; and
    a second source bond wire connecting the source electrode of the second vertical p-channel power field-effect transistor to a fifth lead,
    wherein, the common-source wire provides a current-sensing resistor having a resistance value adjusted by its dimensions and type of material used.

19. The switch of claim 18 further comprising a switch control circuit connected to a plurality of control leads.

20. The switch of claim 19 wherein the switch control circuit comprises an n-channel control field effect transistor having a substrate attached to a sixth lead to form a drain terminal, a gate electrode connected to a seventh lead via a bond wire, and a source electrode connected to an eighth lead via a bond wire.

21. The switch of claim 19 wherein the common-source bond wire is configured to perform the function of a fuse element, disconnecting a current path when a magnitude of current flowing through the switch reaches a predetermined value.

* * * * *